United States Patent [19]

Childers

[11] Patent Number: 4,743,857
[45] Date of Patent: May 10, 1988

[54] DIGITAL/ANALOG PHASE-LOCKED OSCILLATOR

[75] Inventor: Scott E. Childers, Owasso, Okla.

[73] Assignee: Telex Computer Products, Inc., Tulsa, Okla.

[21] Appl. No.: 840,527

[22] Filed: Mar. 13, 1986

Related U.S. Application Data

[63] Continuation of Ser. No. 601,509, Apr. 18, 1984, abandoned.

[51] Int. Cl.$^4$ ............................................... H03L 7/18
[52] U.S. Cl. ...................................... 329/50; 329/122; 375/120; 331/1 A; 331/25
[58] Field of Search .................. 329/50, 106, 107, 122; 331/1 A, 25; 375/81, 120

[56] References Cited

U.S. PATENT DOCUMENTS 4,105,947 8/1978 Crowley .............................. 331/1 A
4,339,731 7/1982 Adams ................................. 331/1 A
4,456,884 6/1984 Yarborough, Jr. ............. 331/1 A X Primary Examiner—Eugene R. LaRoche
Assistant Examiner—Robert J. Pascal
Attorney, Agent, or Firm—Head & Johnson

[57] ABSTRACT

A phase-locked oscillator (PLO) driven or derived clock system, the frequency of which is higher by a factor N than the frequency of the bit reference clock of incoming streams of data bits. The derived clock is designed to be maintained in synchronism with the bit reference clock. Two counters are provided, both of which are driven by the derived clock. The reference counter counts to N/2 and outputs a pulse. The other counter counts to N, outputs a pulse and starts again. The two counters provide output pulses which are coincident whenever the derived or PLO clock is in synchronism with the data clock. This is determined by a phase detector which includes a pair of identical latches, each of which is set by one of the two counters. The outputs of the latches go to an AND gate, the output of which resets the latches. The outputs on the two Q leads from the latches go to an amplifier which outputs a signal which is other than zero, only when there is lack of synchronism. This signal can be positive or negative, depending on which clock leads or lags the other one. The output of the amplifier controls a voltage controlled oscillator so that the derived clock will be maintained in synchronism with the incoming data.

1 Claim, 2 Drawing Sheets

DIGITAL/ANALOG PHASE-LOCKED OSCILLATOR

This is continuation application of Ser. No. 601,509 filed Apr. 18, 1984 abandoned.

BACKGROUND OF THE INVENTION

This invention lies in the field of digital recording systems. More particularly, it concerns apparatus for maintaining a derived clock whose frequency is N times that of the data edges of an incoming stream of data bits and is in synchronism with the stream of incoming data bits.

While there are a number of published designs of voltage-controlled oscillator (VCO) clocks, or phase-locked oscillator (PLO) clocks, for providing such identity of phase between a derived clock and the data clock, they all have difficulties in the sense that they require the use of adjustable resistance devices, such as potentiometers and other devices, which have a high failure rate. The present invention is self-adjusting. Also, it integrates the phase error as compared to a sample and hold device, thus making data recovery faster and with fewer errors.

SUMMARY OF THE INVENTION

It is a primary object of this invention to provide a simple, rapid, high-speed digital/analog phase-locked oscillator which has circuit simplicity and low error rate.

It is a further object of this invention to provide a system which integrates the timing errors to obtain a better measure of the lack of synchronism between the derived clock and the data clock.

These and other objects are realized and the limitations of the prior art are overcome in this invention by providing an input system which provides the data edge of the incoming data to a first counter. The system includes a voltage controlled oscillator (VCO) or phase-locked oscillator (PLO) which provides output pulses at a selected frequency which is a multiple N times the frequency of the data edges of the incoming signal. The incoming data edges are applied to a first counter to start counting at the derived clock rate for N/2 counts, at which time the counter is stopped and outputs a first pulse. A second counter is provided which counts N pulses of the derived clock and outputs a second pulse. The first and second pulses go respectively to first and second latches, the Q outputs of which go to an AND gate. The output of the AND gate, when it is positive, resets the latches. The coincidence of the first and second pulses, therefore, is detected by the latches and the AND gate.

The two outputs of the latches also go to a balanced amplifier, or comparator, which compares the potential on the two outputs; that is, on the two latch outputs. If the first and second pulses are coincident, the time between the setting and resetting of the latches becomes exceedingly small, and no current goes through the pair of leads to the amplifier. Thus, no correcting voltage is applied to the VCO. On the other hand, if the first and second pulses are not coincident—meaning that there is a phase difference between the two clocks; that is, the data clock and the derived clock—then there will be a corresponding potential, plus or minus, on the intput to the amplifier which will provide a corresponding output potential to the VCO and will cause a corresponding change in frequency of the derived clock, and this correction will be continued until the two clocks are brought into synchronism.

BRIEF DESCRIPTION OF THE DRAWINGS

These and other objects and advantages of this invention and a better understanding of the principles and details of the invention will be evident from the following description taken in conjuntion with the appended drawings, in which.

DESCRIPTION OF THE PREFERRED EMBODIMENT

Figure 1:
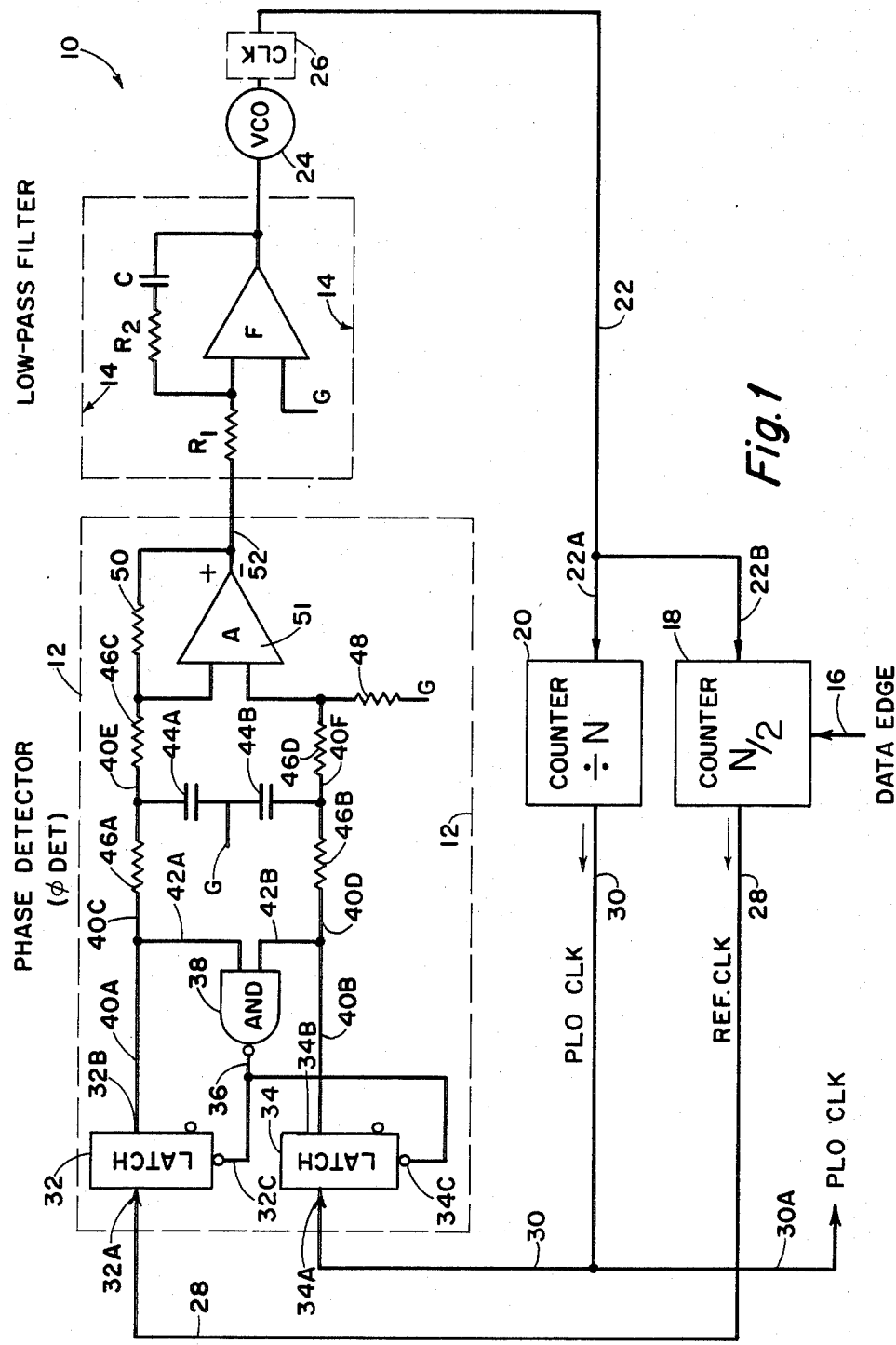
FIG. 1 is a schematic circuit diagram of one embodiment of this invention.

Referring now to FIG. 1, there is shown in schematic form one embodiment of this invention indicated in general by the numeral 10. There is indicated by a numeral 12 in a dashed box a circuit for a phase dectector and by dashed box 14 a circuit for a low pass filter.

At the bottom of FIG. 1 there are two boxes 18 and 20 which represent schematically, respectively, electrical pulse counters, a first of which counts up to a number N/2 and provides a first electric pulse. The other counts electrical pulses up to a total of N, at which time it outputs a second electrical pulse, resets, and starts counting again. The first box 18 after reaching a count of N/2 puts out the first electrical pulse and resets, waiting for the next data edge to start it again.

The first counter in box 18 has an input signal on line 16 which is the stream of data bits which are to be recorded. This receives electrical pulses at the frequency of the leading edges of the sequential bits. The counter is made on the data edge of the input data, and counted at the frequency of the clock.

A voltage controlled oscillator 24, which can be of standard design, hasthe property of outputting an electrical signal of a frequency which depends upon the voltage impressed upon its input. This voltage controlled oscillator is the device that controls the recording of the incoming data bits.

Shown as a separated dashed box 26 is a clock which outputs a set of pulses which are timed one pulse for each of the cycles of the voltage controlled oscillator 24. The frequency of the electrical pulses from the box 26 will be N times the frequency of the bit rate on the input line 16. The output of the phase controlled clock 26 goes to both of the adders 18 and 20.

The purpose of the apparatus in FIG. 1 is to take an input signal on line 16 which represents the data edge of a continuing series of magnetic or electrical pulses derived from a magnetic recording on a moving system, which may be tape, disc or other medium, and to control a separate oscillator, and clock 26 to follow precisely the variations in frequency of the input signal on line 16. The number N is at the choice of the designer. For convenience, and not by limitation, the number N will be chosen to be 48. Thus, the oscillator or clock output will be approximately 48 times the bit rate on line 16.

The pulse train, at a frequency N times the bit rate, which comes from the clock 26, goes by way of line 22 to both of the inputs of the counters 18 and 20. Since the second counter 20 counts to a total of N pulses, it starts counting on the data edge on line 16 while the first counter 18 which starts on the data edge of signal 16 only counts to N/2, but it repeats itself at intervals equal to the time between successive data edges of the incoming data. Thus, the electrical pulses that are outputted from the two counters are, respectively, zero and 180 degrees out of phase with the data edges on 16.

As will be fully explained in connection with FIG. 2, the operation of this system depends upon the coincidence or lack of coincidence of pulses which are created at the data edge and which compare the pulses from the reference signal which comes from counter 18 with the output of the phase controlled clock 26. If one or the other of these two sets of pulses are not exactly coincident, then the phase detector 12 outputs an analog voltage either plus or minus, depending on which of the two sets of pulses; that is, the reference or the output clock, leads or lags the other. If one leads, a positive voltage is generated which increases the frequency of the voltage controlled oscillator and thus of the phase controlled clock 26. If the other set of pulses lead, then a negative voltage is passed to the voltage controlled oscillator, which lowers the frequency. In this way, a servo action is maintained with the phase controlled oscillator always being brought back into coincidence with the frequency N so that the pulses submitted to the phase detector will be in phase.

The phase detector shown schematically in the box 12 includes two inputs, 28 and 30, which go to latches 32 and 34 respectively. One of the latches 32 is controlled by the first electrical pulse, which is the output of the reference counter 18. The other latch 34 is set by the second electric pulse output of the second counter 20 after it has counted a complete set of N pulses. When the latches are set, a selected voltage is placed upon the output terminals 32B and 34B, respectively, which go by lines 40A and 40B, etc., to the inputs of the amplifier 51. Also connected across the lines 40A and 40B is an AND gate (or an NAND gate). When the two inputs to the AND gate carry a signal greater than a selected magnitude, then the output will have a corresponding signal appear on the output lead 36 which goes to both of the reset terminals 32C and 34C of the latches. In other words, one or the other of the latches will be set first, depending on whether the data edge pulses are leading the clock pulses or vice versa.

Assume the reference pulse which sets the latch 32 arrives first. This places a positive voltage, or a true voltage, on the lead 40A. The electrical circuit arrangement is adjusted so that when only one line 40A or 40B becomes true, the latches are not reset. However, if the first electric signal arrives first, it places a positive voltage on the lead 40A carrying a positive current into the amplifier 51. A short time later when the phase-locked oscillator clock outputs a second electric pulse from the second counter 20, then the second latch 34 will set and put a true voltage on the line 40B. In this condition, when the potentials on the two inputs of the gate 38 are alike, a corresponding potential is placed on the output, and that resets the two latches. Now the magnitude of total charge that has passed into the amplifier 51 depends on how long the current has flowed in one or the other of the two lines 40A or 40B. That causes an output current to go from the amplifier 51 to the voltage controlled oscillator 24, which causes its frequency to be momentarily changed. In this way, if the two frequencies are not in phase, then the voltage controlled oscillator changes its frequency of oscillation in such a direction as to make them in phase. In this way, it "locks" the clock to the input signal, and it varies in frequency as the input signal varies in frequency.

As is well known in the electronic art of gates, such as the latches and the AND gate, for example, inverters such as are indicated by the small circles at the reset terminals 32C and 34C of the two latches and at the output 36 of the AND gate 38 if they are all present or if they are all absent, do not change the basic operation of the circuit. It is just a matter of convenience of design that, for example, an AND gate can be used in 38 or a NAND gate, provided that the inverters are absent or present at the reset terminal of the latches.

There are series resistances 46A, 46B, 46C and 46D in the lines 40A and 40B, and there are a pair of capacitors 44A and 44B connected in series across these two lines 40E and 40F with the center point grounded. This makes the amplifier fully balanced and to act in a similar manner when the voltage goes positive as when it goes negative.

I have shown in FIG. 1 in the dashed box 14 one configuration of a low-pass filter. This is a well-known electronic device, the design of which is fully covered in publications, can be purchased over the counter, and need not be further described.

Also, it will be noted that the voltage controlled oscillator 24 and the clock 26 are shown as two separate boxes, although it is very common to include them both in the same enclosure since the clock is essentially the output of the oscillator. However, since the phase detector outputs an analog voltage, plus or minus, it was felt that separating these two related features would make it clearer that the voltage controlled oscillator is what controls the output clock 26, dependent upon the timing of the first and second electric pulses which set the two latches in the phase detector 12.

Figure 2:
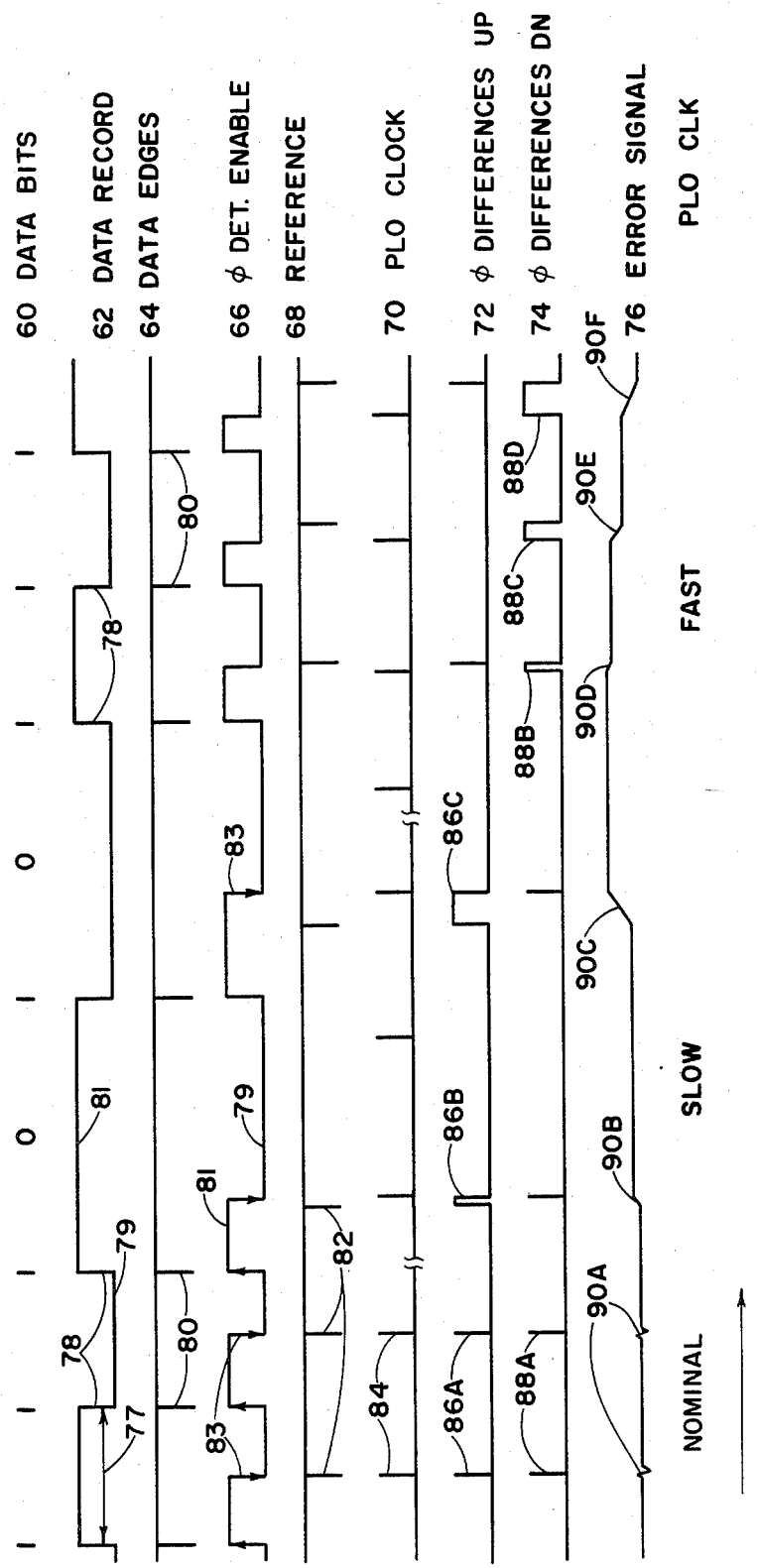
FIG. 2 is a timing diagram which illustrates the operation of the circuit of FIG. 1.

Referring now to FIG. 2, there is shown a timing diagram of the various voltages and pulse transitions that occur in the operation of the circuit of FIG. 1. There are a number of horizontal rows or traces numbered 60, 62, 64, 66, 68, 70, 72, 74, 76. The row 60 indicates the type of data bit; that is, whether the data bit is a 1 (one) or a 0 (zero). Row 62 shows that when the data bit is at 1, there is a transition 78 from one level 79 to a different level 81, and vice versa. The presence of a transition indicates that the bit is a 1. The lack of a transition indicates that the data bit is a 0. Numeral 77 indicates the time duration between data edges.

Trace 64 is entitled data edges; that is, each transition of the data from level 79 to 81 or vice versa creates a pulse such as those shown and numbered as 80. By reference to row 66, it will be seen clearly that when the data edge of a one bit is present, there is an upward transition of the trace from a level 79 to a level 81. In order that all the one bit transitions show a data edge increasing in level; that is, from 79 to 81, there must be a corresponding transition downward, indicated as 83, which occurs midway between the two data edges 80 representing successive one bits. When a zero bit occurs, there is no transition and, of course, no downward transition such as 83, for example.

The downward transitions 83 in row 66 occur substantially halfway between the bit intervals; that is, between the successive one bit transitions. The timing of the pulses shown in row 68, which are called the reference pulses 82, is provided by the first counter 18, which counts up to N/2 pulses of the clock 26, which would be halfway through the N counts for the full bit interval.

Since the counter 18 is started by the data edge which arrives over line 16, it always starts with the incoming data and, therefore, forms the reference trace. These pulses are 82. Trace 70 shows the pulses as counted by counter 20 of the phase-locked oscillator (PLO) 24 and clock 26. If these are coincident, then it indicates that the derived clock output 26; that is, the PLO clock, is running in synchronism, or in-phase, with the reference signal, and the two are locked together. If the derived clock 26 which is responsive to the VCO or PLO 24 should change in timing, then the pulses as 82 and 84 will no longer be simultaneous or coincident, and that will indicate a lack of lock between the generated clock 26 and the input signal.

What is needed now is a coincidence detector, or phase detector, to determine when these sets of pulses 82 and 84 are in synchronism. Consequently, the output of the first counter 18; that is, the reference clock, goes to a first latch 32 over lead 28, and the PLO clock or derived clock goes over lead 30 to a second latch 34. The pulses outputted by the counters 18 and 20, going respectively over the lines 28 and 30 to the latches 32 and 34, set the latches on their arrival at the set terminals 32A and 34A, respectively. The latches can be, for example, as simple as a flip-flop which is a very common article of commerce in the electronic industry and needs no further description. Such a latch is a device which when a voltage of a selected magnitude occurs at the set terminal 32A, for example, will create a corresponding voltage of selected magnitude at the Q output terminal 32B which outputs on line 40A which eventually goes to one terminal of an amplifier 51. Similarly, the PLO clock pulses on line 30 set the latch 34 and produce a corresponding voltage on the Q output 34B which goes to the opposite input terminal of the amplifier 51. The latch output signals respectively on lines 40A and 40B go to an AND gate 38 which has a single output 36 which is connected to both the reset terminals 32C and 34C, respectively.

As was explained previously, the AND gate can be either an AND gate or a NAND gate, provided there are inverters in series with the reset terminals 32C and 34C. For convenience, the circuit will be described in terms of an AND gate.

When the two voltages on lines 40A and 40B that go to the two inputs of the AND gate are both positive potential, the output of the AND gate would be positive at point 36 and would reset those latches. If the set voltage on latch 32 comes in earlier to set latch 32 before latch 34 is set, then a positive voltage will be present on one lead of the AND gate before it appears on the other input lead from line 40B; and when the two voltages are positive, then the latches are reset again. If there is no coincidence of the pulses that set the two latches, then there is voltage on lead 40A or 40B, depending on which lead is set before the other one. Thus, there will be an unbalanced voltage impressed on the amplifier 51 through the two leads 40A, 40C, and 40E, compared to 40B, 40D, and 40F.

There is a low pass filter applied across the input to the amplifier 51 in the form of the series resistances 46A and 46B in combination with the capacitors 44A and 44B, the junction between which goes to ground. This may or may not be necessary, depending upon the noisiness of the signals which are derived from the reference clock and the PLO clock.

If the voltage that appears on lead 40E starts before the voltage on lead 40F before they are both terminated by resetting of the latches, then there will be a positive output of the amplifier on the output lead 52 which goes to the voltage controlled oscillator 24. This VCO is an electronic assembly, which is sold as a commercial item, wherein a change of magnitude of a DC voltage applied to the input will cause the output voltage to vary at a different frequency. Generally a positive voltage applied to the VCO will cause the frequency to rise and, vice versa, if a negative voltage is applied, the frequency will drop.

As previously explained, a second low pass filter indicated generally at 14 which is also a commercial item of electronics can be inserted between the amplifier and the VCO and thus help prevent faulty action due to high frequency transients in the output lead to the VCO.

Referring back to FIG. 2 again, line 68 shows the reference pulses from the input data, and row 70 shows the PLO clock with pulses 84. If the clock is of precisely the same frequency as the input data frequency, then the pulses 82 and 84 will be coincident. If they are not locked together, then they will not necessarily be coincident between these pulses. Row 72 shows what happens when the reference pulse leads the derived clock pulse; that is, the clock pulse is slower than the reference pulse. The magnitude of the phase difference between the two clocks creates a positive pulse on line 72, the width of which is proportional to the phase difference between the reference and the PLO clock. Thus, the current represented by trace 76 would show practically no change in voltage at the first two transitions since they are coincident. When there is a slight phase difference as shown on trace 72, there will be a slight positive voltage above the amount 90B of the trace. When the phase difference is greater according to 86C, there will be a larger increase of potential 90C on the lead to the VCO. This voltage being too high will again show phase differences in the opposite direction, and there will be corresponding decreases in potential 90D, 90E, and 90F in order to bring the phase difference between the PLO clock and the reference clock in synchronism.

Trace 76 represents the error signal which is the result of a phase difference between the PLO clock and the reference clock. This remains as a control voltage on the VCO even though there may be a lack of coincidence pulse as shown on trace 66 where there is no transition, because of the presence of a zero data bit. In other words, this control system does not require that there be a one-to-one set of coincident pulses for measuring the error. The error is noted at the coincidence or lack of coincidence of the pulses whenever there is a one-bit transition. However, the error pulse is maintained by the circuitry in spite of the fact that there is no transition at the zero data bit so that the device integrates a number of cycles or a number of data bits in order to derive the error signal which is used to drive the VCO in a direction to bring the two clocks; that is, the PLO clock and the reference clock, into synchronism.

While the invention has been described with a certain degree of particularity, it is manifest that many changes may be made in the details of construction and the arrangement of components without departing from the spirit and scope of this disclosure. It is understood that the invention is not limited to the exemplified embodiments set forth herein but is to be limited only by the scope of the attached claim or claims, including the full range of equivalency to which each element thereof is entitled.

What is claimed is:

1. A phase-locked oscillator adapted to be locked in phase with the data edge of an input signal which comprises a series of bit pulses, both ones and zeros, comprising:
   (a) free running clock means responsive to a voltage controlled oscillator, the frequency of said derived clock being N times the bit frequency of said input signal;
   (b) first counter means controlled to read up to N/2 and to provide a first electric pulse, said first electric pulse being coincident with the middle transition of each one bit;
   (c) second counter means controlled to read up to N and to provide a second electric pulse, and to reset and to start counting again, said first and second counters being responsive respectively to the data edges of said input signal and the output of said derived clock means;
   (d) first and second latches each having an input terminal, an output terminal and a reset terminal and adapted to be set respectively by said first and second electric pulses;
   (e) an amplifier having a first and a second input and an output;
   (f) a balanced resistor-capacitor networks comprising a first and second resistor in series between said first latch output terminal and said amplifier first input, a third and fourth resistor in series between said second latch output terminal and said amplifier second input, a first capacitor between the juncture of said first and second resistor and ground, and a second capacitor between the juncture of said third and fourth resistor and ground;
   (g) and AND gate having two input terminals and an output terminal, the input terminals being connected to said output terminals of said latches, the output terminal being connected to said reset terminals of said latches, the voltage at said output of said amplifier being detemined by relative amount of time each latch is conductive;
   (h) a filter of selected bandwidth having an input and an output, the input being connected to said amplifier output; and
   (i) a voltage controlled oscillator having an input connected to said filter output and an output connected to said clock means, the clock being connected to said second counter means.

* * * * *